(12) United States Patent
Tsuchiaki et al.

(10) Patent No.: US 7,157,777 B2
(45) Date of Patent: Jan. 2, 2007

(54) SEMICONDUCTOR DEVICE INCLUDING SILICIDED SOURCE AND DRAIN ELECTRODES

(75) Inventors: Masakatsu Tsuchiaki, Kanagawa-Ken (JP); Shoko Tomita, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/821,886

(22) Filed: Apr. 12, 2004

(65) Prior Publication Data
US 2004/0256645 A1    Dec. 23, 2004

(30) Foreign Application Priority Data
Apr. 28, 2003 (JP) ............... 2003-124123

(51) Int. Cl.
*H01L 29/76* (2006.01)
(52) U.S. Cl. .................. 257/382; 257/384
(58) Field of Classification Search ........... 257/757, 257/762, 382, 384, 388
See application file for complete search history.

(56) References Cited

U.S. PATENT DOCUMENTS

| | | | |
|---|---|---|---|
| 6,271,132 B1 | 8/2001 | Xiang et al. | |
| 6,683,356 B1 | 1/2004 | Tsuchiaki | |
| 2003/0235984 A1* | 12/2003 | Besser et al. | 438/683 |
| 2004/0061184 A1* | 4/2004 | Lu et al. | 257/384 |
| 2004/0229473 A1* | 11/2004 | Bohr | 438/738 |

FOREIGN PATENT DOCUMENTS

| | | |
|---|---|---|
| JP | 2000-150669 | 5/2000 |
| JP | 2001-284284 | 10/2001 |
| JP | 2002-368008 | 12/2002 |
| JP | 2002-543623 | 12/2002 |

OTHER PUBLICATIONS

U.S. Appl. No. 10/256,164, filed Sep. 27, 2002, Tsuchiaki.
U.S. Appl. No. 10/947,381, filed Sep. 23, 2004, Tsuchiaki.

* cited by examiner

*Primary Examiner*—Thanh Nguyen
(74) *Attorney, Agent, or Firm*—Oblon, Spivak, McClelland, Maier & Neustadt, P.C.

(57) ABSTRACT

A method for manufacturing a MOSFET equipped with a silicide layer over shallow source and drain junctions without leakage generation is provided. By restricting the temperature of manufacturing steps after the silicide formation below a critical temperature Tc, which is defined below as a function of a junction depth Dj from 20 nm to 60 nm, leakage generation is practically suppressed.

$$Tc = a \times Dj + b,$$

where $a = 6.11$ $(20 < Dj \le 26)$ $\phantom{a} = 1.60$ $(26 < Dj \le 60)$, $b = 290.74$ $(20 < Dj \le 26)$ $\phantom{b} = 408$ $(26 < Dj \le 60)$, Dj is a junction depth (nm) measured from the lower surface of the silicide layer, and Tc is a critical temperature (° C.) during a heat treatment.

12 Claims, 9 Drawing Sheets

SEMICONDUCTOR DEVICE INCLUDING SILICIDED SOURCE AND DRAIN ELECTRODES

CROSS-REFERENCE TO RELATED APPLICATION

This application is based upon and claims the benefit of priority from prior Japanese Patent Application No. 2003-124123, filed on Apr. 28, 2003, the entire contents of which are incorporated herein by reference.

BACKGROUND OF THE INVENTION

1. Field of the Invention

The present invention relates to a semiconductor device and a method of manufacturing a semiconductor device. In particular, the present invention relates to a high-speed miniaturized field effect transistor including silicided source and drain electrodes, and a method of manufacturing such a transistor.

2. Background Art

In order to further achieve a high-speed and highly-functional semiconductor circuits, demand for the miniaturization and the larger scale integration of individual semiconductor devices is continually growing. However, shrinking the dimensions of MOSFETs (Metal Oxide Semiconductor Field Effect Transistors), i.e., main components of such semiconductor circuits induces various kinds of problems.

For example, as the channel length (i.e., the length of a gate electrode) of a MOSFET is decreased, the threshold voltage thereof decreases accordingly (short-channel effect). Due to high sensitivity of the threshold voltage of the small size MOSFETs on the channel length, even a slight variation of channel length (i.e., the gate length) leads to undesirable change of a threshold voltage from the value intended at the time of the designing of the semiconductor circuit and eventually impairs the entire function of the circuit. It entails that, since the value of the threshold voltage strongly depends on the size of the gate electrode, a slight process variation may not be tolerated to obtain an intended electronic function and extremely tight control of the process conditions is necessitated to achieve successful manufacturing. This is very inconvenient for the manufacturing of a semiconductor circuit, such as a DRAM (Dynamic Random Access Memory), which requires a large number of highly uniform elements.

Such a short channel effect is caused by the distortion of the electric fields originated from the source and drain electrodes of the MOSFET reaching the central area of the channel region as the channel length decreases. Such an influence of the electric fields of the source and drain electrodes can be avoided by bringing up the pn junction positions of the source and drain regions closer to the surface of the semiconductor device (i.e., to make the pn junction portions shallower). However, shallower pn junctions leads to an increase in the electric resistance of the source and drain electrodes, which hinders the high-speed transmission of electric signals.

In order to solve such a problem and to reduce the electric resistance of the source and drain electrodes, upper parts of the source and drain electrodes are made to react with a certain metal (silicidation). Metal elements such as Co, Ti, Ni, etc., are used to form a silicide (i.e., chemical compound between Si and the metal). Among them, Co and Ni are the most suitable for the use in miniaturized LSIs, since no increase in electrical resistance (thin line effect) is observed even when the silicides thereof are formed on very thin silicon lines. However, at the time of the silicidation reaction or during a heat treatment performed thereafter, a part of metal atoms drifts away from the reaction surface or silicide/silicon interface and migrates deep into the silicon substrate, where the source and drain regions are formed. Thus, when the pn junctions are made shallow, the diffused metal atoms would easily reach the junction depth, thereby causing a severe junction leakage current.

Actually, in the case of Co, a rapid thermal annealing at a temperature of 800° C. for 30 seconds is required in order to form a low-resistance phase of silicide, $CoSi_2$. However, since the diffusion of Co atoms is extremely fast, the Co atoms reach 150 nm in depth even with the aforementioned short heat treatment. FIG. 18 shows the junction leakage current as a function of $n^+/p$ junction depth after 35 nm-thick $CoSi_2$ formation. For comparison, the junction leakage currents of reference samples without silicide formation are also plotted. Clearly, additional leakage generation is already evident at the depth of 150 nm, which is far deeper than the depth of the silicide layer. This is caused by the diffusion of Co atoms into the substrate.

When Ni is used, the leakage current can be reduced due to lower reaction temperature and smaller silicon consumption of Ni silicidation reaction as compared to the case of using Co. Also, for Ni silicidation, formation of an iridium intermediate layer between a silicon substrate and a nickel silicide layer is disclosed in, e.g., Japanese Patent Laid-Open Publication No. 2002-367929, in order to decrease the junction leakage current further. The technique claims that the formation of the iridium intermediate layer increases the phase transition temperature from NiSi to $NiSi_2$, resulting in leakage suppression even at a temperature of 850° C.

However, without such a special treatment, a rapid diffusion of metal atoms is unavoidable at the interface between a metal and silicon, as described above. The metal atoms deeply diffused into the silicon substrate form gap states in the silicon forbidden band. Naturally, the gap states formed at the source and drain junctions generate leakage currents.

When leakage currents flow through the source and drain junctions, the performance of the device is degraded. In the case of a storage element such as a DRAM, the information stored therein is erased, and the primary function of the semiconductor device is lost.

In order to solve the aforementioned problems, an elevated source drain method has been utilized. In this method, semiconductor layers are selectively and additionally formed (for example, silicon is grown) on surface portions of a semiconductor substrate where source and drain electrodes are to be formed. Because the surfaces of this additionally formed semiconductor layers are higher than the original semiconductor surface (i.e., the surface where a channel is to be formed), pn junction depths of the source and drain are shallow relative to the original semiconductor surface, but deep relative to the newly formed surfaces, securing the enough depth of the electrode while suppressing the short channel effects. Such a selective silicon growth can be achieved by using an epitaxial growth method.

In this method, however, the depth of the pn junction of the source and drain must be precisely set to the same level as the original semiconductor surface or kept slightly deeper than this level. If the junction depth does not reach the channel surface, the drivability of the MOSFET is severely compromised. On the other hand, when the junction depth is considerably deeper than the channel surface, a short-channel effect becomes a problem.

However, the epitaxial growth technique is very sensitive to the surface conditions where the selective growth is to be performed. For example, the thickness of the silicon layer to be grown strongly depends on the surface states (such as roughness, asperity, impurity, and residual damages) and the crystal structure of the substrate. Furthermore, the quality of the layer (i.e., the presence of crystal) also depends on the surface condition as well. Thus, due to the influence of a natural oxide layer on the substrate or residual damage caused at the time of the gate electrode processing, the thickness and the quality of the silicon layer formed on the individual source and drain regions may change significantly. When the thickness of the additional silicon layer is not uniform, it is impossible to adjust the pn junction depth of all devices precisely to the original semiconductor substrate surface (i.e., the surface where a channel is formed). This is because, since the impurities used to form the source and drain are implanted through the surface of the additionally formed silicon layer, the junction depth need to be targeted in reference to the distance from this newly formed surfaces. Non-uniform thickness means variable positions of the original semiconductor surface relative to the additionally formed silicon surfaces, thus no way of accurate ajustment.

In addition, when the quality of the additionally formed silicon layer are not uniform, it becomes difficult to accurately position the pn junction at the intended location. Since the speed of the diffusion of impurities is modified (transient enhanced diffusion) depending on the quality of the layer, if the quality of the silicon layer are not uniform, even when a predetermined thermal diffusion of impurities is applied in order to position the junction portions at the channel surface, the diffusion would proceed in an unexpected manner for each regions, resulting in non-uniform junction depths.

The same applies to the diffusion of metal atoms at the time of silicidation. Even with the additional silicon layer, when the thickness or quality of the layer is not uniform, the metal atoms can easily penetrate the junction depth at a position of thin thickness or poor quality, thereby causing a junction leakage current.

Furthermore, the speed of the diffusion of metal atoms itself is very high. Accordingly, the thickness of the additionally formed silicon layer should be very thick to block the diffusion amounting to 150 nm. However, for the aforementioned reasons, it is practically impossible to achieve a uniform and selective silicon growth of 150 nm-thickness. Moreover, the additional layer of 150 nm-thickness would have almost the same height as the gate electrode. Accordingly, with such a thickness, it becomes difficult to secure the electric isolation between the gate and the source and drain electrodes when silicidation reaction is made to proceed on these electrodes at a time (self-aligned silicidation, or salicide process).

Moreover, the thickness of the selectively grown silicon layer becomes thinner adjacent to the gate electrode. Accordingly, the shortest distance between the additional surface (where the metal is to be deposited) and the junction depth is determined at this portion. Thus, no matter how thick the selectively grown silicon layer is made at the other portions, its ability to block the leakage generation is not enhanced.

As described above, shrinkage of the MOSFET's dimensions requires commensurate shallowing of the source and drain junctions. At the same time, to secure high speed operation, silicidation of the source and drain regions is necessary. However, for silicidation of shallow junctions, the high-speed diffusion of metal atoms from the silicide induces substantial junction leakage current.

In order to suppress the leakage by an elevated source drain structure, it is necessary to increase the thickness of the selectively grown silicon layer nearly to the thickness of the gate electrode. However, formation of such a thick selective silicon layer of uniform thickness and uniform quality has been very difficult.

SUMMARY OF THE INVENTION

A method of manufacturing a semiconductor device according to a first aspect of the present invention includes: forming a silicide layer having an NiSi phase on source and drain regions in a semiconductor substrate so that a depth of a junction formed between the source and drain regions and the semiconductor substrate is located from 20 nm to 60 nm below a lower surface of the silicide layer; and after the formation of the silicide layer having the NiSi phase, performing manufacturing steps at a temperature not exceeding a critical temperature Tc, which meets the following expression:

$$Tc = a \times Dj + b,$$

where $$a = 6.11 \ (20 < Dj \leq 26)$$
$$= 1.60 \ (26 < Dj \leq 60),$$
$$b = 290.74 \ (20 < Dj \leq 26)$$
$$= 408 \ (26 < Dj \leq 60),$$

Dj is a junction depth (nm) measured from the lower surface of the silicide layer, and Tc is a critical temperature (° C.) during a heat treatment.

A semiconductor device according to a second aspect of the present invention includes a semiconductor device having: a gate electrode formed on a silicon semiconductor substrate; source and drain regions formed at both sides of the gate electrode in the silicon semiconductor substrate; and an NiSi layer formed on the source and drain regions, a depth from a lower surface of the NiSi layer to a junction between the source and drain regions and the silicon semiconductor substrate being from 20 nm to 60 nm, Ni atoms existing in the source and drain regions, and a concentration of the Ni atoms at the junction surface being at $1.6 \times 10^{14}$ cm$^{-3}$ or less.

DESCRIPTION OF THE EMBODIMENTS

Hereinafter, an embodiment of the present invention will be described with reference to the accompanying drawings.

First, before describing the embodiment of the present invention, the course of events for achieving the present invention will be described below.

Generally, the compound formation reaction (i.e., silicidation reaction) between Si and Ni can proceed at a temperature of 450° C., which is much lower than a temperature for $CoSi_2$ formation, i.e., 800° C. At this temperature, a low electric resistivity phase, i.e., NiSi, is formed. When the NiSi phase is subjected to a yet higher temperature of about 750° C., it is further transformed to a final phase, i.e., $NiSi_2$, which has a higher electric resistivity than NiSi. Naturally, low resistivity phase NiSi should be employed for LSI fabrication. Because this NiSi can also be formed at a lower temperature, NiSi seems to be a promising material to reduce the diffusion of metal atoms and to suppress the resultant junction leakage.

Figure 2:
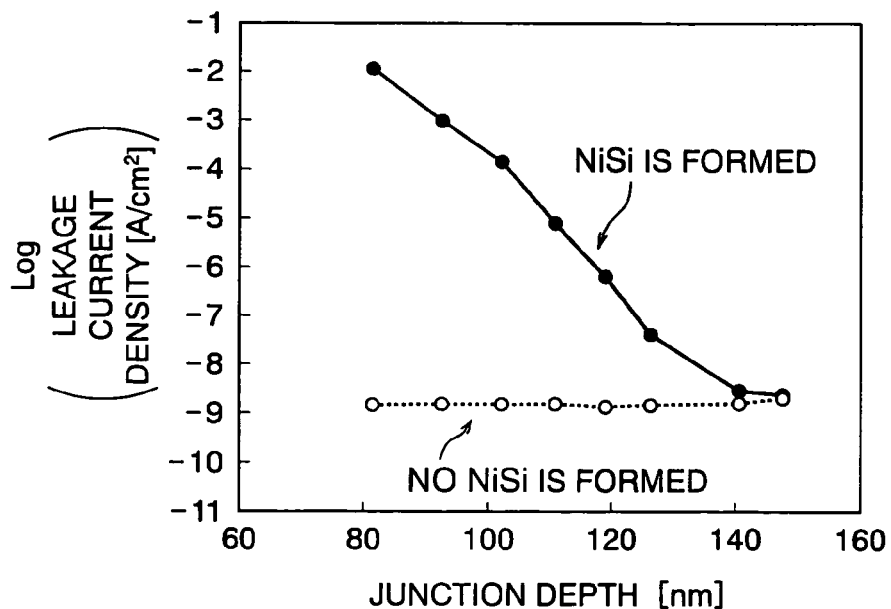
FIG. 2 shows a junction leakage current density as functions of n$^+$/p junction depth when a NiSi layer of 30 nm thickness is formed, and the reference values measured when no silicide is formed.

However, the present inventors have found that the NiSi phase is thermally very unstable even at temperatures well below the onset of the phase transition. FIG. 2 shows the leakage current density as a function of n+/p junction depth when a 30 nm-thick NiSi layer is formed over the junctions and subsequently annealed at 500° C. for 90 minutes. FIG. 2 also shows reference data when no silicide is formed on the n+/p junctions. This annealing is typical for current LSI fabrication in order to obtain electric connection between the silicide portion and the metal wiring. Evidentially, measurable leakage generation is already detected at the depth of about 140 nm, which is far deeper than the silicide layer itself (i.e., 30 nm). The leakage is caused by Ni atoms liberated away from the NiSi layer and migrated deep into the substrate during the annealing. Strikingly, Ni atoms diffused deeply into the silicon substrate even if the heat treatment is performed at 500° C. for 90 minutes, which is a far lower temperature than the phase transition temperature of 750° C. from NiSi to $NiSi_2$.

The present inventors have conducted an in-depth study about the thermal stability of the thin NiSi. As a result, the present inventors have found that the thermal stability of the NiSi layers changes precipitously with the temperature and successfully identified a critical temperature over which NiSi become thermally unstable. In other words, the generation of junction leakage current induced by Ni atoms can be effectively avoided by limiting the temperature of the heat treatment after the formation of NiSi to be lower than this critical temperature.

This will be described in more detail below with reference to the accompanying drawings.

First, in order to clarify the critical point of the thermal stability of NiSi, the present inventor prepared samples, each including a silicon substrate and a different depth of pn junctions. After a Ni layer is deposited on each sample, an RTA (Rapid Thermal Annealing) was performed in a nitrogen atmosphere at a temperature of 450° C. in order to form a NiSi layer having a thickness of 30 nm. Thereafter, a heat treatment at a temperature of 400° C., 450° C., or 500° C. for up to 90 minutes was performed on each sample. The ramping rate of the temperature was set to be 100° C./min. Finally, the thermally induced leakage density (the right-hand vertical axis) was measured at each different junction depths. On the other hand, the Ni concentration (the left-hand vertical axis) distributed in the silicon substrate of each sample was also measured by the use of the backside SIMS method. Because the backside SIMS method perform the SIMS analysis from the backside of the samples, knocking effects from the NiSi surface layer is avoided and the accurate Ni concentration in the silicon substrate can be obtained.

Figure 1:
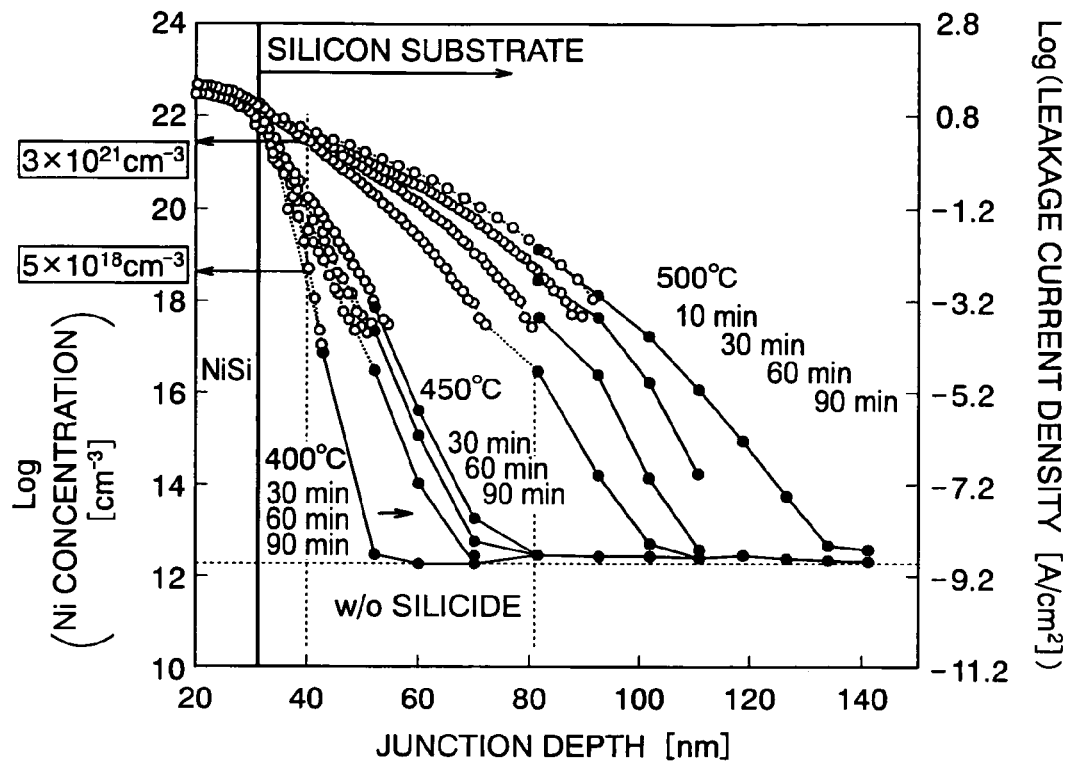
FIG. 1 shows a junction leakage current density as functions of pn junction depth and a depth distribution of Ni concentration contained in a silicon substrate of various samples subjected to various heat treatments.

FIG. 1 shows, as functions of pn junction depth, the observed values of junction leakage current density (represented by closed circles) for various kinds of heat treatment conditions. The depth distributions of Ni concentrations (represented by open circles) contained in the silicon substrates of the respective samples, obtained by the use of the Backside SIMS method, are also correlated to the corresponding leakage-depth profiles. The right-hand vertical axis represents the junction leakage current density, and the left-hand vertical axis represents the Ni concentration contained in a silicon substrate.

As can be understood from FIG. 1, an excellent matching is obtained between each respective leakage-depth profiles and corresponding Ni depth distributions. Accordingly, there is no doubt that the Ni atoms diffused into the silicon substrates are the cause of the generation of junction leakage current.

At 400° C., no additional leakage current by the Ni atoms is observed even with prolonged heat treatment if the junctions are deeper than 20 nm from the lower surface of the NiSi layer. The sudden increase of the leakage current for the junctions shallower than 20 nm is also independent of the annealing time and originated from intrinsic Ni infiltration into the silicon substrate associated with the silicidation reaction itself. Thus, this depth (i.e., 20 nm) is the intrinsic limitation for junction shallowing inherent to NiSi formation.

To extend this limitation further to a shallower depth, direct reaction between Ni and silicon substrate must be avoided by the use of a barrier layer such as a thin oxide layer. However, the presence of such barrier layer would surely increase the resultant contact resistance between the NiSi layer and the silicon substrate. Therefore, insertion of a barrier layer invalidates the original purpose of applying the silicide layer for resistance reduction. Furthermore, when Ni and silicon substrate are in direct contact, the Ni atoms, which drifted into the silicon substrate during the silicidation, form energy levels in the silicon forbidden band in the close vicinity of the NiSi/Si interface. Such energy levels facilitate the transmission of electrons through the Schottky barrier between the NiSi layer and the silicon substrate by the quantum mechanical tunnel effect. In other words, lower and practically viable contact resistance must be achieved by allowing the Ni atoms to drift freely into the silicon substrate during the silicidation.

At 450° C., additional leakage generation at a deeper depth is already in evidence. And small but unmistakable ingression of the leakage-depth profiles deeper into the silicon substrate with the annealing time is clearly visible. Evidentially, the Ni atoms start to be released from the NiSi phase and commence migration into the silicon substrate.

At 500° C., measurable leakage generation deep inside the silicon substrate and sizable inward migration with the annealing time is clearly observed. Correspondingly, the Ni atoms diffused deep into the silicon substrate. Strangely, however, a leakage-depth profile extrapolated to the heat treatment time of 0 minutes does not match the depth profile of the leakage current at a temperature of 400° C. This means that, at the initial stage of the heat treatment, the Ni atoms must have burst into the silicon substrate almost instantaneously.

Here, it should be noted that for all heat treatments, no phase transition from NiSi to $NiSi_2$ was observed. Thus, the aforementioned behavior of Ni is intrinsic to NiSi.

Next, the peculiar dynamics of Ni migration in the silicon substrate will be described in more detail below.

Figure 3:
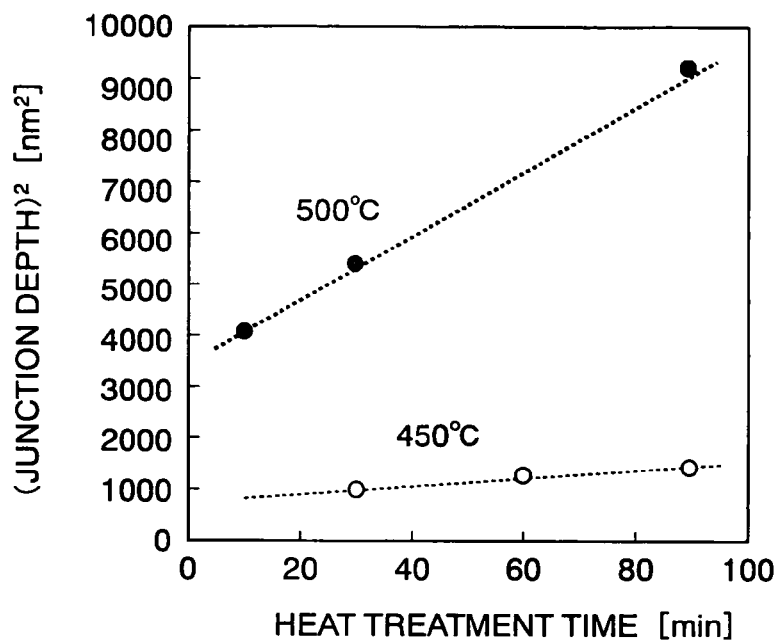
FIG. 3 shows the square of the junction depth at which the leakage current density is $1 \times 10^{-7}$ A/cm$^2$ (i.e., leakage depth) as a function of annealing time. The annealing temperature is 450° C. and 500° C.

FIG. 3 shows the square of the junction depth or leakage depth (at which the leakage current density is $1 \times 10^{-7}$ A/cm$^2$) as the function of annealing time both for 450° C. and 500° C. The linear dependencies observed in FIG. 3 point to stable diffusion as a governing migration kinematics of the leakage source (i.e., Ni) at both temperatures. Needless to say, the slope of the data points corresponds to a so-called diffusion coefficient. The observed diffusion coefficient of Ni at 500° C. as the leakage source was 62 nm/minute and the activation energy thereof was 2.03 eV. Strikingly, these values are far different from those values known for atomic Ni in Si ($1.0 \times 10^{10}$ nm$^2$/min., 0.47 eV: K. Graff, "Metal Impurities in Silicon-Device Fabrication, Springer", 1995). This striking disparity suggests clustering of Ni atoms as the leakage source, leading to the observed slower but stable diffusion.

Another remarkable feature shown in FIG. 3 is that intersection with vertical axis at the heat treatment time of 0 minutes is far off the origin especially for 500° C. Clearly, at an early stage of the annealing, the Ni atoms must have burst into silicon substrate over the intrinsic infiltration associated with silicidation. This is the aforementioned initial burst of Ni caused by the heat treatment.

Figure 4:
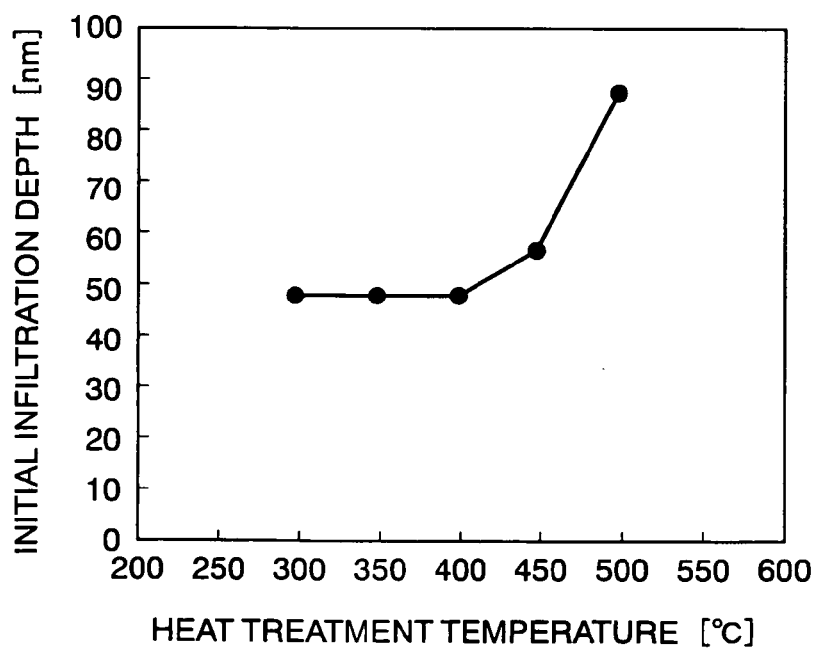
FIG. 4 shows the initial infiltration depth of Ni, calculated by the extrapolation of (square of the leakage depth) vs. (annealing time) plot to 0 minute.

FIG. 4 shows thus obtained initial infiltration depth of Ni (i.e., the sum of the intrinsic infiltration depth of Ni caused by the silicidation reaction and the depth of the initial burst of Ni during the heat treatment performed at a later stage) as a function of the heat treatment temperature. It should be noted that the depth includes 30 nm of the NiSi thickness. Up to 450° C., the initial infiltration of Ni is dominated by intrinsic infiltration caused by the silicidation reaction. However, at 500° C., the initial burst of Ni during the heat treatment overwhelms the intrinsic infiltration. It seems that before Ni clustering and subsequent onset of slower but stable diffusion, Ni is released from the NiSi layer in an atomic form and ultra-fast atomic diffusion ensues for a very short period of time at an early stage of the annealing. This atomic phase is only transitory and very ephemeral. Quick evanescence and rapid coalescence of the atomic Ni result in the observed initial burst.

As described above, the present inventors have discovered that the migration kinematics of Ni in a silicon substrate is governed by the initial infiltration and subsequent stable diffusion mechanism. Considering the high activation energy (2.03 eV) of the diffusion coefficient and the steep increase of the initial burst at around 500° C., it can be easily understood that leakage depth (i.e., the depth below which substantial leakage generation is unavoidable) will increase precipitously with the annealing temperature. In other words, it is necessary to limit the heat treatment temperature after the formation of the NiSi layer to be under a certain critical temperature at around 450° C. in order to suppress the leakage generation.

Figure 5:
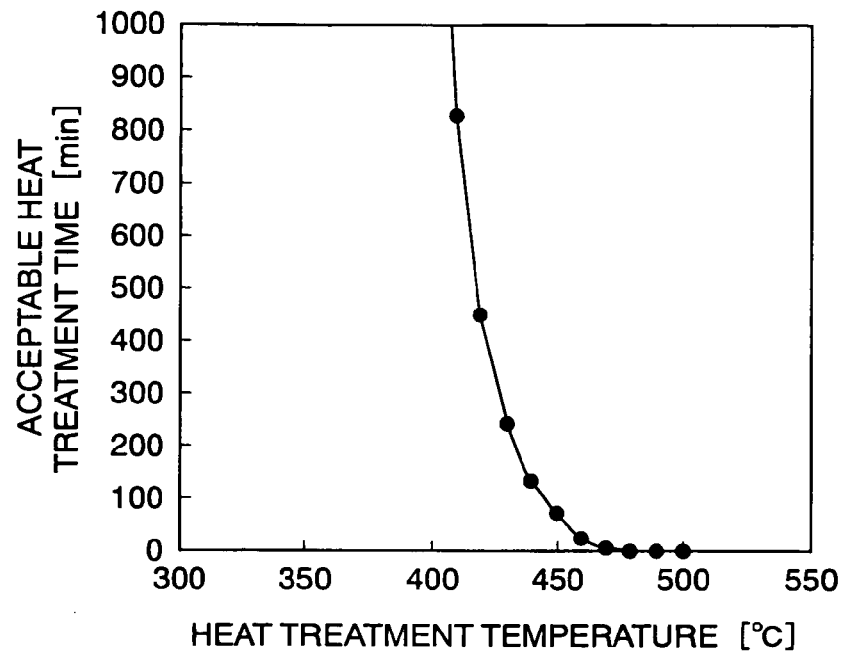
FIG. 5 shows the allowable heat treatment time as a function of the heat treatment temperature. The heat treatment for shorter than this period will not generate a leakage current by infiltration or diffusion of Ni atoms into a silicon substrate. Junction depth of 50 nm below silicide layer is assumed.

Actually, FIG. 5 shows the allowable annealing time when a junction is formed 50 nm below the lower surface of the NiSi layer as the function of the heat treatment temperature. The allowable annealing time is defined as an upper limit of the duration of the heat treatment to suppress the leakage density by Ni infiltration and diffusion less than $1.0 \times 10^{-7}$ A/cm$^2$ (corresponding to the Ni concentration of $1.6 \times 10^{14}$ cm$^{-3}$ at the junction depth). As can be understood from FIG. 5, no heat treatment can be allowed when the heat treatment temperature exceeds 480° C. Obviously, this is the critical temperature. At a temperature exceeding this critical temperature, NiSi becomes thermally unstable and a substantial amount of Ni atoms reach the junction depth, thereby greatly increasing the leakage current. However, once the heat treatment temperature is lowered from this value, the allowable heat treatment time increases precipitously thanks to the high activation energy and the rapid decrease of the initial Ni infiltration as mentioned before. For example, at a heat treatment temperature of 400° C., a heat treatment time can be secured which causes practically no problem for manufacturing a semiconductor device. Thus, this figure exemplifies the presence of a critical temperature, below which the leakage generation is practically negligible, and above which the leakage generation devastates device fabrication.

Figure 6:
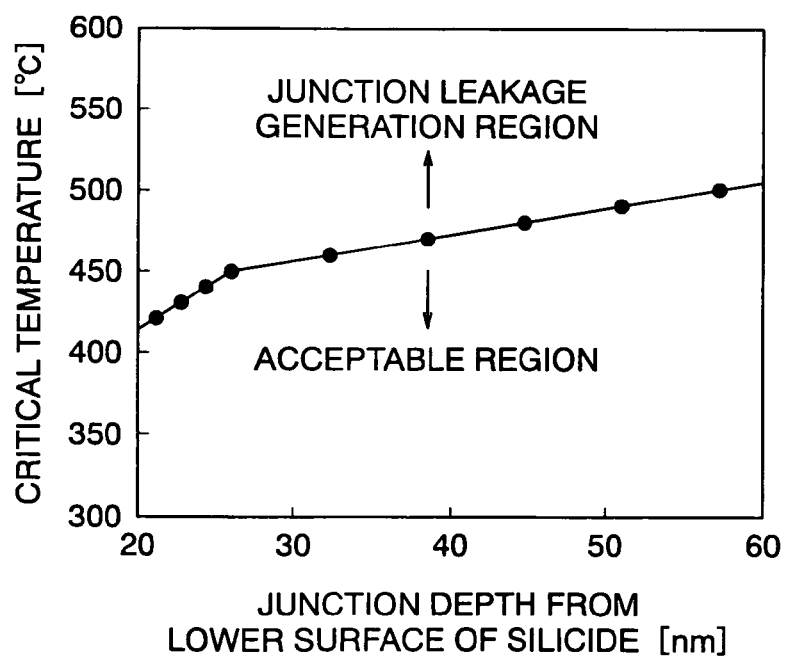
FIG. 6 shows the critical temperature as a function of the junction position depth measured from the lower surface of the NiSi layer, the critical temperature being the critical temperature acceptable for not generating a leakage current, and the junction depth being from 20 nm to 60 nm.

Of course, the same applies to other junction depth as well. FIG. 6 shows the critical temperature as a function of the junction depth from the lower surface of the NiSi layer in a range from 20 nm (which is the intrinsic limitation of junction shallowing using NiSi) to 60 nm. The present inventors also found that the critical temperature can be accurately expressed by the following expression, $$Tc = a \times Dj + b, \quad (1)$$

where $a = 6.11 \ (20 < Dj \leq 26)$ $= 1.60 \ (26 < Dj \leq 60)$, $b = 290.74 \ (20 < Dj \leq 26)$ $= 408 \ (26 < Dj \leq 60)$, Dj is a junction depth (nm) from the lower surface of NiSi, and Tc is a critical temperature (° C.) during the heat treatment.

As described above in great detail, during the process of studying the thermal stability of NiSi, the present inventors have identified peculier migration kinematics of Ni in a silicon substrate (i.e., the initial infiltration and subsequent stable diffusion). In addition, the present inventors have found that the infiltration depth of Ni into the silicon increases rapidly above a certain temperature. In other words, in order to avoid the generation of a junction leakage current due to Ni, it is necessary to limit the heat treatment temperature after the formation of NiSi to be lower than a certain critical temperature. The present inventors also have clarified the critical temperature as a function of the junction depth from the lower surface of NiSi layer in a range of junction depth from 20 nm to 60 nm.

Accordingly, it is possible to prevent the Ni atoms from reaching the junction depth by forming an insulating layer, etc. on the NiSi layer at a temperature not exceeding the critical temperature obtained by FIG. 6 or the expression (1) in accordance with the junction depth of the source and drain of a MOSFET measured from the lower surface of the NiSi layer, thereby preventing the generation of a leakage current.

Likewise, by using Al or Cu, metal wiring can be formed through via-holes opened in the insulating layer to the NiSi layer at a temperature, not exceeding the critical temperature obtained by FIG. 6 or the expression (1).

In this manner, it is possible to manufacture an ultra high speed miniaturized semiconductor device with shallow source and drain junctions and low resistivity silicide layers thereon, while the leakage currents through the source and drain junctions are significantly suppressed.

(Embodiment)

Hereinafter, a semiconductor device according to an embodiment of the present invention will be described with reference to FIGS. 8 to 16, which are cross sectional views showing the steps of manufacturing the semiconductor device of this embodiment. The semiconductor device of this embodiment has a salicide type MOSFET structure, in which the diffusion of Ni atoms into the silicon substrate is curbed, and a NiSi layer is formed on the source, drain, and gate electrodes in a self-aligned manner. This semiconductor device is manufactured by a simplified manufacturing process.

Figure 8:
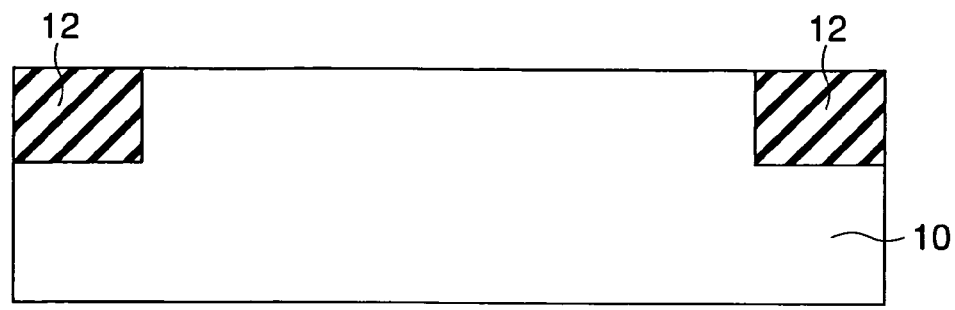
FIG. 8 is a cross sectional view showing a step of manufacturing a semiconductor device according to the embodiment of the present invention.

First, as shown in FIG. 8, shallow trenches are formed on a surface of a silicon semiconductor substrate 10 with a lithography process, an RIE (Reactive Ion Etching) process, etc. Then, an insulating layer is formed by the CVD (Chemical Vapor Deposition) method, and the surface thereof is planarized by the CMP (Chemical Mechanical Polishing) method, thereby forming shallow trench isolation (STI) regions 12.

Figure 9:
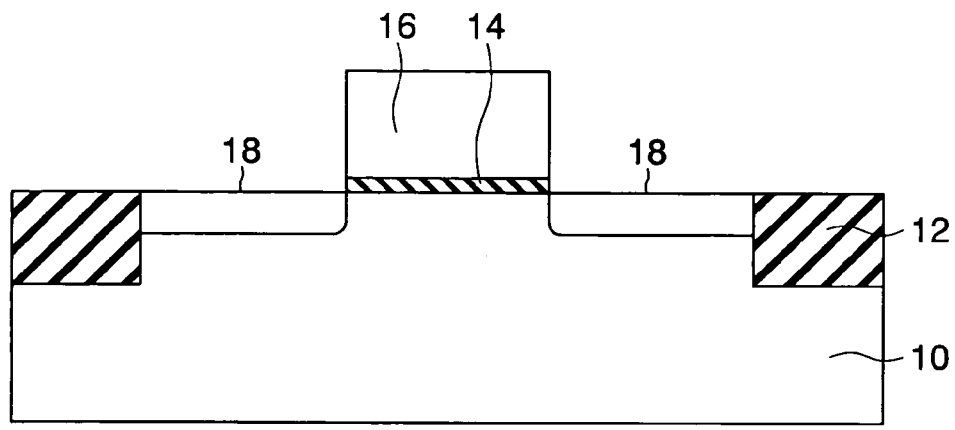
FIG. 9 is a cross sectional view showing a step of manufacturing a semiconductor device according to the embodiment of the present invention.
Figure 10:
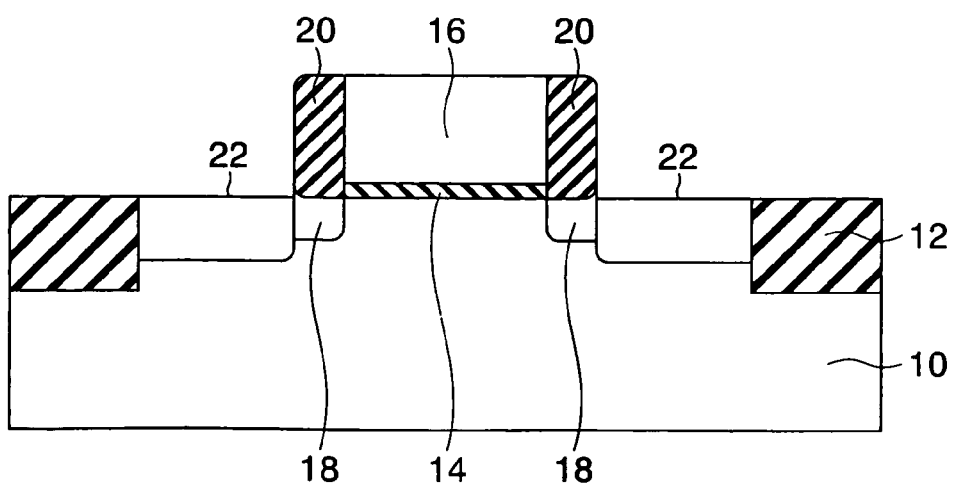
FIG. 10 is a cross sectional view showing a step of manufacturing a semiconductor device according to the embodiment of the present invention.

Subsequently, as shown in FIG. 9, a gate dielectric film 14 having a thickness of, e.g., 5 nm is formed on a main surface of the substrate 10 by using an effective well-known technique such as a thermal oxidation method. Thereafter, a layer 16 of a gate electrode material such as polycrystalline silicon is deposited by, e.g., a CVD method, so as to have a thickness of, e.g., 200 nm. Then, a resist pattern (not shown in the drawing) is formed of, e.g., a photo resist, by a lithography method, which is used as a mask to pattern the gate dielectric film 14 and the gate electrode 16 by, e.g., the RIE method.

Then, as shown in FIG. 9, ions of an impurity having the opposite conductivity to the substrate 10 is implanted by using the gate electrode 16 as a mask, thereby forming shallow diffusion regions 18 to become source and drain extension regions at both sides of the gate electrode 16, the diffusion regions 18 having the opposite conductivity to the substrate 10.

Subsequently, for example, a silicon nitride layer having a thickness of 20 nm is deposited by using the CVD method. Thereafter, an anisotropy etching such as the RIE process is performed so as to the silicon nitride layer being selectively remained at the vertical side portions of the gate electrode 16, thereby forming gate sidewalls 20 (refer FIG. 10). Then, an ion implantation of an impurity having the opposite conductivity to the substrate 10 is performed by using the gate electrode 16 and the gate sidewalls 20 as masks, thereby forming diffusion regions 22 to become source and drain regions at the both sides of the gate electrode 16, the diffusion regions 22 having the opposite conductivity to the substrate 10. By performing a rapid thermal annealing (RTA), the impurities are activated. The depth of the diffusion regions 22 reaches, for example, 80 nm from the surface of the silicon substrate 10.

Figure 11:
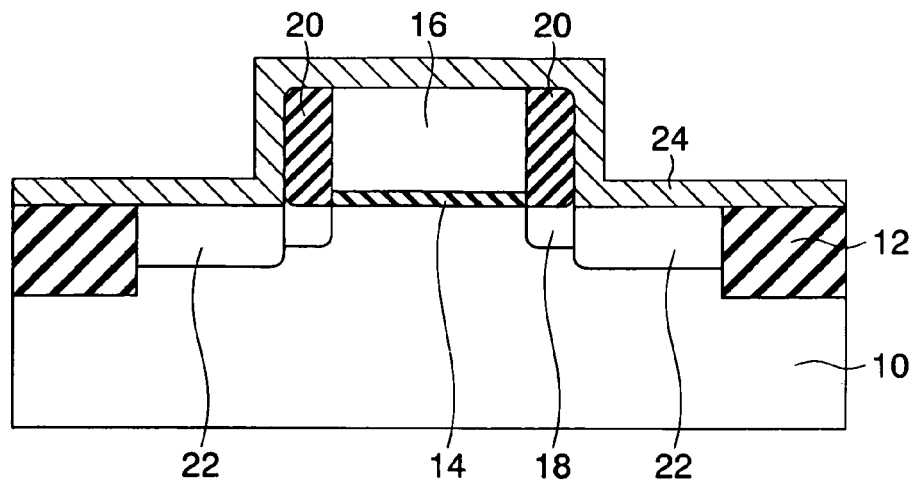
FIG. 11 is a cross sectional view showing a step of manufacturing a semiconductor device according to the embodiment of the present invention.

Then, as shown in FIG. 11, an Ni layer 24 having a thickness of, e.g., 12 nm is deposited on the entire surface by using, e.g., a sputtering method. If necessary, a metal material, such as Ti, TiN, etc., can deposited thereon so to serve as a cap layer.

Figure 12:
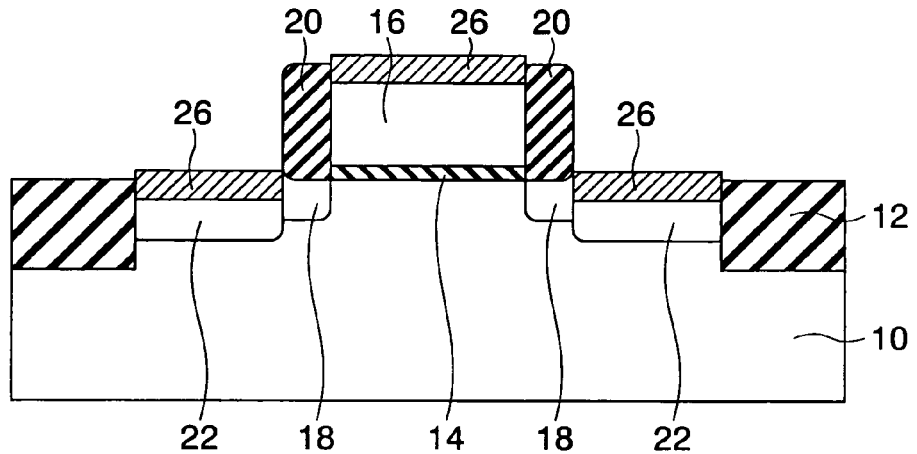
FIG. 12 is a cross sectional view showing a step of manufacturing a semiconductor device according to the embodiment of the present invention.

Subsequently, as shown in FIG. 12, the semiconductor substrate is subjected to a rapid heat treatment, for example at a temperature of 450° C. for 30 seconds. The silicidation reaction proceeds selectively at the portions where the Ni layer 24 is in directly contact to silicon. As a result, a silicide layer 26 of NiSi is formed on the source, gate and drain regions. The thickness of the resulting NiSi layer 26 is approximately 30 nm. Accordingly, the junction depth of the source and drain regions 22 becomes about 50 nm below the lower surface of the NiSi layer 26. During this heat treatment, no NiSi$_2$ phase is formed.

In this embodiment, no interlayer is employed. Therefore, the Ni atoms drift freely into the silicon substrate up to 20 nm deep from the lower surface of the NiSi layer 26 during the silicidation. As demonstrated in FIG. 1, at a depth about 10 nm from the lower surface of the NiSi layer 26, the Ni concentration becomes $5 \times 10^{18}$ cm$^{-3}$. This intrinsic Ni infiltration is favorable because the gap states formed in this close vicinity of the silicon/silicide interface facilitate electron transfer through the Shottky barrier and realize a low contact resistance between the NiSi layer 26 and the source and drain regions 22. If the infiltration of Ni atoms is to be blocked further, the free reaction between Ni and the silicon substrate must be inhibited by an interlayer and the aforementioned favorable electric contact must be sacrificed. Accordingly, in view of an electrical contact, it is preferable that Ni atoms are infiltrated into the silicon substrate 10 to a certain degree. However, the Ni concentration in the close vicinity of the interface cannot be raised unlimitedly. An extremely high Ni concentration at the point 10 nm from the lower surface of the NiSi layer 26 signifies substantial Ni diffusion taking place deep inside the substrate, thus generation of severe leakage. In fact, as shown in FIG. 1, if a heat treatment at a temperature of 500° C. is performed at a later stage, the Ni concentration at a point 10 nm is increased to $3\times10^{21}$ cm$^{-3}$ while, at the same time, leakage current is generated at about 50 nm below the bottom of the NiSi layer 26 (i.e., at the junction depth of 80 nm). Thus, in order to realize a low contact resistance on leakage-free junctions, the Ni concentration at a point 10 nm from the lower surface of the NiSi layer 26 should be ranged from $5\times10^{18}$ cm$^{-3}$ to $3\times10^{21}$ cm$^{-3}$, which is an essential condition.

Thereafter, as shown in FIG. 12, unreacted Ni layer on the gate sidewalls 20 and the STI regions 12 are selectively removed by wet etching in a mixed solution containing sulfuric acid and hydrogen peroxide.

Figure 13:
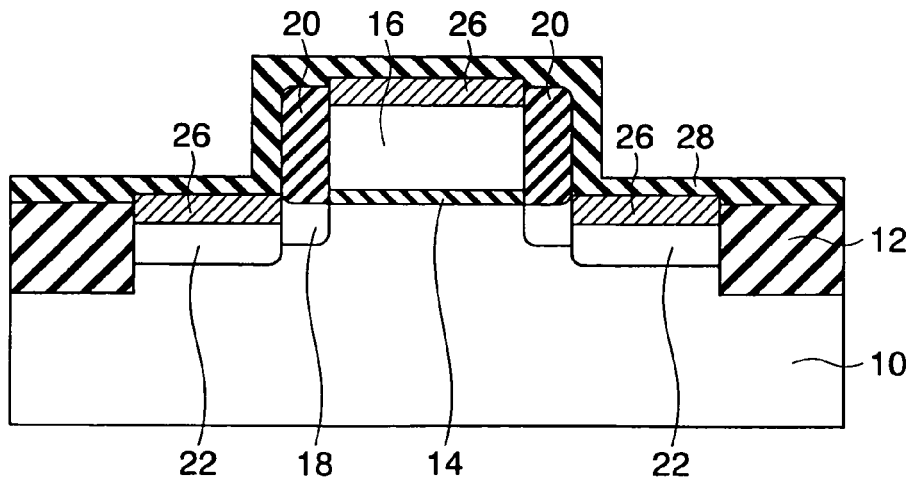
FIG. 13 is a cross sectional view showing a step of manufacturing a semiconductor device according to the embodiment of the present invention.

Then, as shown in FIG. 13, a silicon nitride layer 28 having a thickness of, e.g., 20 nm is conformaly deposited on the entire surface of the substrate so as to cover the NiSi layer 26. Of course, the formation temperature of the silicon nitride layer 28 must not exceed the critical temperature obtained from FIG. 6 or the expression (1) in accordance with the junction depth of the source and drain regions 22 of the MOSFET, as described above. In this embodiment, the junction depth of the source and drain regions 22 are 50 nm below the bottom of the NiSi layer 26. Accordingly, the critical temperature in this embodiment is 480° C.

The silicon nitride layer 28 will serve as a barrier layer or an etch-stop layer, i.e., a liner layer, during the contact hole formation through an interlayer dielectric layer (not shown in the drawings) at a later stage. Thanks to this liner layer, it is possible to form a contact hole without accurately aligning the contact holes to the positions of the NiSi regions 26 on the source and drain regions (i.e., borderless contact) because the contact etching (i.e., dielectric etching which could also etch the dielectric material in the STI regions) stops at this liner layer without encroaching the STI region even when the hole opening overlaps the STI region by slight misalignment. Accordingly, it is possible to simplify the device manufacturing process, thereby decreasing the manufacturing costs.

Figure 7:
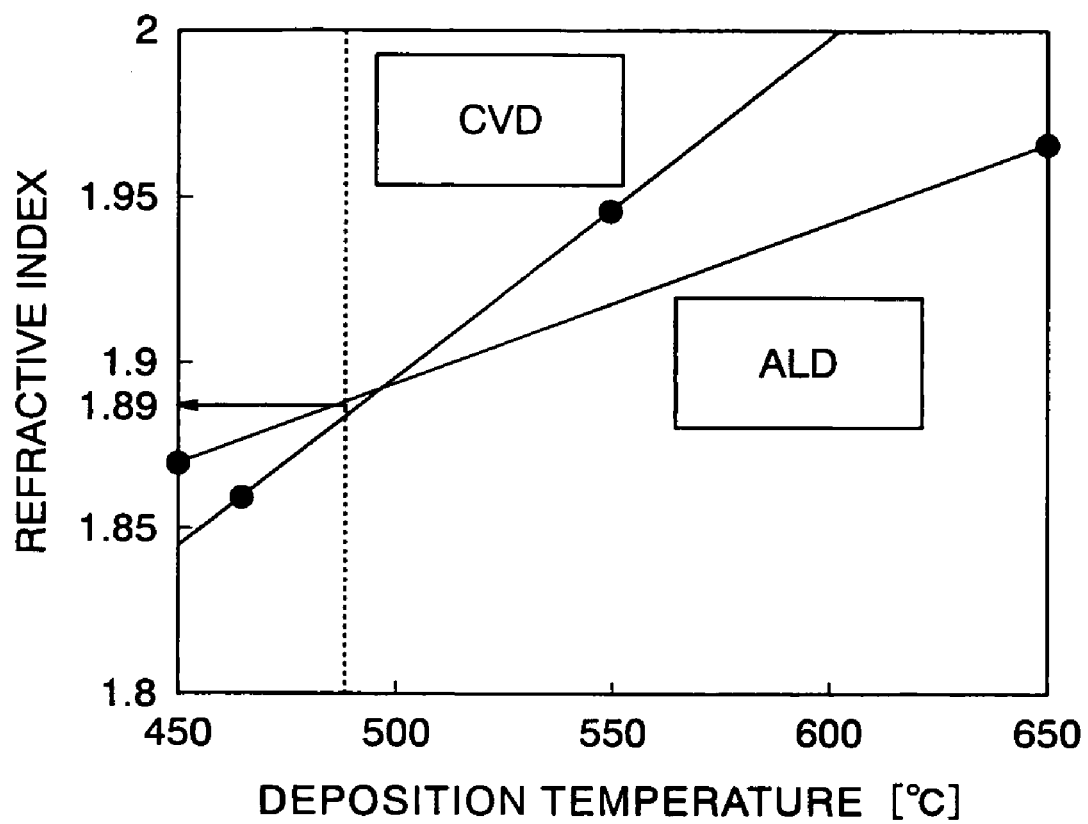
FIG. 7 shows the refractive index of a silicon nitride layer as a function of the deposition temperature, the silicon nitride layer being formed by a chemical vapor deposition method or an atomic layer deposition method.

A uniform deposition of the silicon nitride layer 28 at a low temperature can be performed by a CVD (Chemical Vapor Deposition) method using Si$_2$Cl$_6$ and NH$_3$ as the source gases, or an ALD (Atomic Layer Deposition) method using SiH$_2$Cl$_4$ and NH$_3$ as the source gasses. The present inventors have found that there is a strong correlation between the deposition temperature and the refractive index of the resulting silicon nitride layer. FIG. 7 shows the refractive indexes of the silicon nitride layers formed by the aforementioned two methods as the functions of the deposition temperature. Notably, when the deposition temperature is 480° C. or less, the refractive index of the silicon nitride layer 28 becomes 1.89 or less regardless of the deposition method. Accordingly, the silicon nitride layer 28 serving as a liner layer, which is formed at a temperature lower than the critical temperature, naturally has a refractive index of 1.89 or less. The measurement of the refractive index can be performed by using an optical interferometer (through an ellipsometry technique).

Besides this method, it is also possible to deposit a silicon nitride layer at a lower temperature by a PACVD (Plasma Assisted Chemical Vapor Deposition) method. However, this method suffers inadequate uniformity of the resultant silicon nitride layer compared to that of the aforementioned CVD or ALD method. Nonetheless, the refractive index of the silicon nitride layer formed by PACVD is also 1.89 or less.

In any ways, by maintaining the process temperature below the critical temperature, the Ni infiltration, therefore, the generation of a junction leakage current is prevented.

Figure 14:
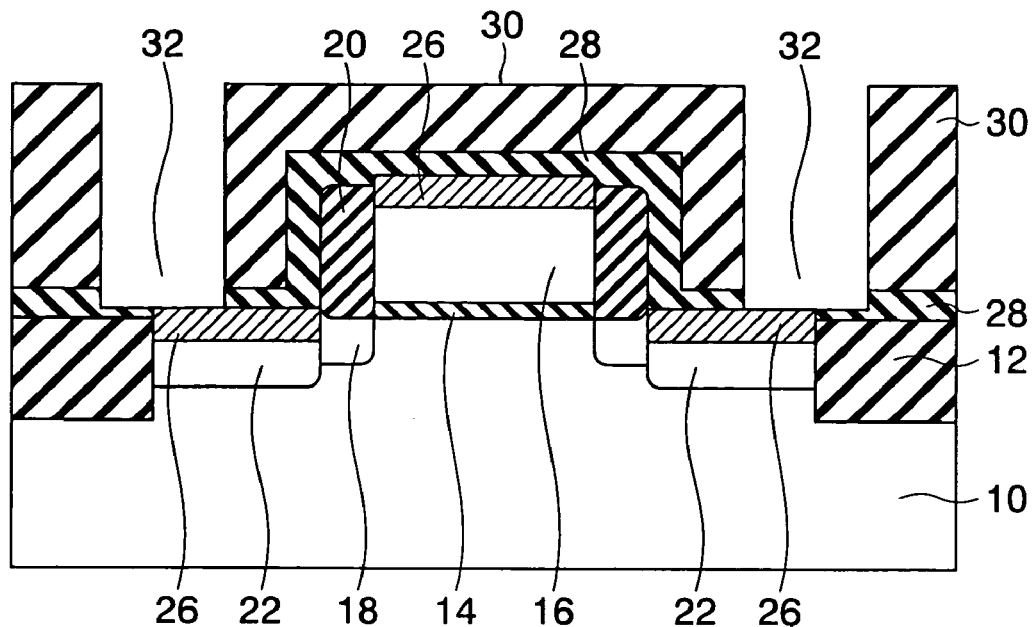
FIG. 14 is a cross sectional view showing a step of manufacturing a semiconductor device according to the embodiment of the present invention.

Next, as shown in FIG. 14, a silicon oxide layer 30 serving as an interlayer dielectric film is formed on the silicon nitride layer 28 serving as a liner layer. As described previously, at this time, the temperature for depositing the silicon oxide layer 30 should be lower than the critical temperature obtained by FIG. 6 or the expression (1), i.e., 480° C., in accordance with the junction depth of the source and drain regions 22 of the MOSFET The silicon oxide layer 30 serving as an interlayer dielectric film should have a flat surface canceling non-planarity of the underlying structures, since metal wiring will be formed thereon at a later stage.

Such a silicon oxide layer having a flat surface can be obtained at a low temperature by, for example, supplying O$_3$ and Si (OC$_2$H$_5$)$_4$, (TEOS) gases at a temperature of 400° C. Otherwise, the silicon oxide layer 30 can be formed by supplying an SOG (Spin on Glass) material or a fluid material containing R$_n$Si(OH)$_{4-n}$ (where R is organic molecule and additive agent) through the spin coating by the use of, e.g., a spinner, and thereafter applying a heat treatment at a temperature of, e.g., 300° C. for 30 minutes in, e.g., a nitride atmosphere in order to remove all the components other than silicon oxide.

Then, as shown in FIG. 14, the silicon oxide layer 30 is patterned by a well-known method, such as a lithography method, an RIE method, etc., thereby opening contact holes 32 down to the NiSi regions 26 on the source and drain regions. The RIE method is better to be performed in two steps. First, an oxide layer is etched selectively with respective to a silicon nitride liner layer. Subsequently, the thin silicon nitride layer 28 remaining on the bottom of the contact holes 32 is removed by a short-time etching process. Since the second etching can be completed in a short period, the damage to the NiSi regions 26 caused by the RIE plasma can be minimized. Furthermore, even if a part of the bottom portion of a contact hole 32 overlaps the STI region 12, it is possible to prevent the penetration of the contact hole 32 into the STI region 12.

Figure 15:
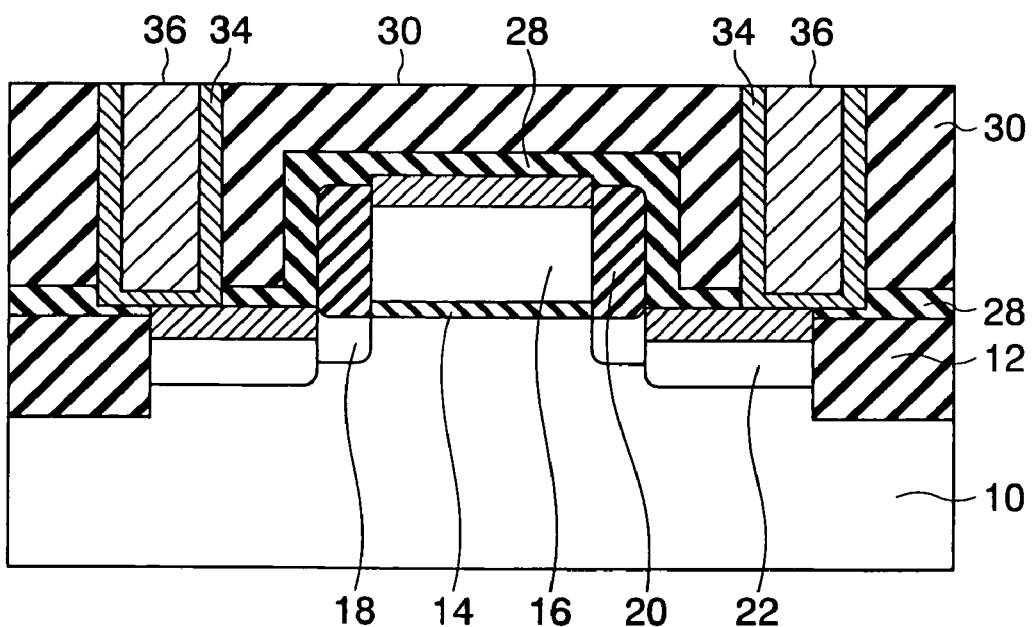
FIG. 15 is a cross sectional view showing a step of manufacturing a semiconductor device according to the embodiment of the present invention.

Next, the upper portion of the NiSi layer 26 exposed at the bottom of each contact hole 32 is subjected to a plasma containing, e.g., NF$_3$ for a short period of time to clean the surface thereof. Subsequently, a barrier layer (barrier metal) 34 of a metal material having a barrier property, e.g., Ta, and having a thickness of, e.g., 5 nm, is formed on the entire surface of the semiconductor substrate by, e.g., a sputtering method, as shown in FIG. 15. This sequence of the processes should be conducted without breaking the vacuum so as not to expose the NiSi surfaces to the atmosphere. Since the upper portion of the NiSi layer 26 is isolated from the atmosphere, the NiSi layer 26 stays un-oxidized. Accordingly, no insulating layer containing oxygen is formed on the NiSi surface and the barrier layer 34 can establish a good electric contact with NiSi. Unlike this case, if an insulating layer containing thin oxygen were formed, it would be necessary to perform a heat treatment at a temperature of about 500° C. in order to establish an electric contact with the NiSi layer 26. By using the method of this embodiment, however, it is possible to establish an electric contact without performing such a heat treatment.

Then, the semiconductor substrate 10 is soaked into an aqueous solution containing $Cu_2SO_4$, and a negative potential is applied in order to coat the entire surfaces of the semiconductor substrate with Cu, which also fills in the contact holes 32. Thereafter, the Cu layer formed on the silicon oxide layer 30 is removed by a well-known method such as a CMP method, thereby remaining Cu 36 within the contact holes 32. The coating can be performed at the room temperature. At this temperature, of course, it is possible to prevent the generation of a junction leakage current.

The filling of the contact holes 32 can also be performed by using Ti instead of Ta as a barrier metal, and by carrying out the sputtering of Cu containing Al at a temperature of, e.g., 400° C. instead of performing the Cu coating method, thereby inducing the fluidity of Al at the surface of the substrate so as to fill in the contact hole 32 with Al (Al-reflow method).

Figure 16:
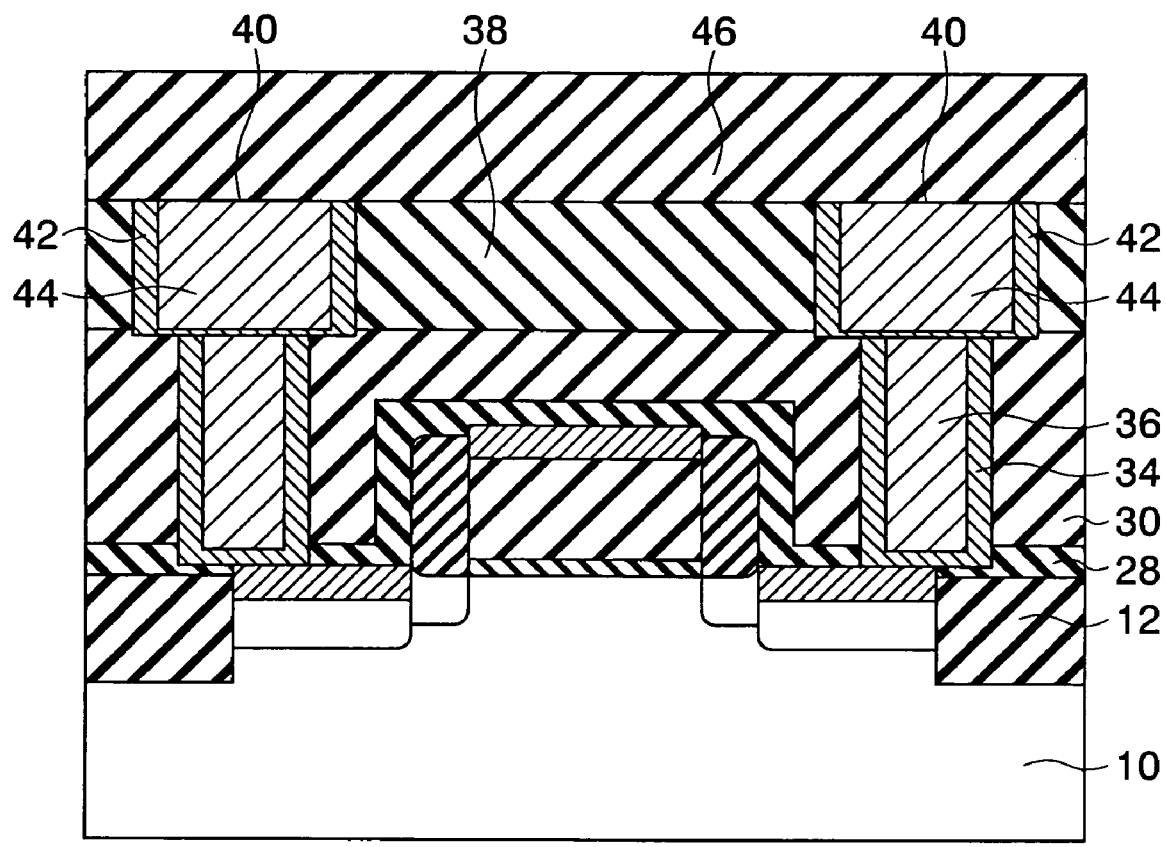
FIG. 16 is a cross sectional view showing a step of manufacturing a semiconductor device according to the embodiment of the present invention.

Then, as shown in FIG. 16, a silicon oxide layer 38 serving as an interlayer dielectric film is deposited. Subsequently, grooves 40 for embedding a wiring material in the silicon oxide layer 38 are formed by a well-known method such as a lithography method, an RIE method, etc. Thereafter, the method as described with reference to FIG. 15 is repeated to form a barrier layer 42 of, e.g., Ta, and metal wiring 44 of Cu, is formed in each groove 40 (damascene method). Then, an insulating layer, e.g., a silicon oxide layer 46, is further deposited so as to cover the upper portion of the wiring material 44. All of the aforementioned steps are performed at a temperature not exceeding the critical temperature. Naturally, the infiltration of Ni atoms from the NiSi layer 26 to the silicon substrate 10 is suppressed, thereby preventing the generation of a junction leakage current.

If necessary, multi-layer wiring is constituted at a temperature not exceeding the critical temperature, and a packaging step is performed, thereby completing a semiconductor device.

In this manner, a MOSFET having a high drivability can be realized, which has a very shallow source and drain depth as well as silicided gate, source, and drain electrodes. The junction leakage current of this MOSFET is suppressed to an extremely low level due to the prevention of Ni diffusion and the contact resistance of the silicide layer 26 to the source and drain regions 22 is also kept low.

As described above in detail, it is possible to prevent Ni atoms from reaching the junction depth by forming an insulating layer over the NiSi layer of the source and drain at a temperature not exceeding a predetermined critical temperature in accordance with the junction depth measured from the lower surface of the NiSi layer, thereby preventing the generation of a leakage current.

More specifically, by forming a silicon nitride layer serving as a barrier layer, or an etching stopper layer, i.e., a liner layer, at a temperature not exceeding a critical temperature obtained by FIG. 6 or the expression (1) in accordance with the junction depth measured from the lower surface of the NiSi layer, the Ni diffusion, therefore the leakage generation, is prevented. At the same time, thanks to the liner layer, it is possible to form contact holes without accurately aligning them on the NiSi regions (formation of borderless contacts). Accordingly, it is possible to simplify the device manufacturing steps, thereby decreasing the manufacturing cost.

Furthermore, since the NiSi layer is formed through direct contact between Ni layer and the silicon substrate, Ni atoms drift freely into the vicinity of the NiSi/Si interface, securing a good electrical contact between the NiSi layer and the source and drain regions.

In addition, by forming a silicon oxide layer having a flat surface at a temperature not exceeding a critical temperature obtained from FIG. 6 or the expression (1) in accordance with the junction depth measured from the lower surface of the NiSi layer, the Ni diffusion, therefore the leakage generation, is prevented. At the same time, it is possible to simplify the planarization step by the use of such a silicon oxide layer, thereby decreasing the manufacturing cost.

Furthermore, by cleaning the upper portion of the NiSi layer at the bottom of each contact hole with a plasma for a short period of time and subsequently forming a barrier metal over the entire surface of the semiconductor substrate without breaking the vacuum, no insulating layer containing oxygen is formed over the upper portion of the NiSi layer. Accordingly, it is possible to maintain an electric contact between the metal material and NiSi without performing a heat treatment at a temperature of about 500° C. Thus, it is possible to prevent the Ni infiltration from the NiSi layer to the silicon substrate, thereby preventing the generation of a junction leakage current.

Moreover, Cu is plate coated so as to fill in the contact holes, thereby completing the filling of a metal material into the contact holes at a temperature not exceeding a critical temperature. Accordingly, the Ni infiltration of Ni atoms from the NiSi layer, therefore the generation of a junction leakage current is prevented.

As described above, according to this embodiment, it is possible to obtain a semiconductor device and a method of manufacturing the same, in which the junction depth of source and drain is kept shallow, the gate, source, and drain are silicided, the junction leakage current is also kept low, and the height of the source and drain is substantially lower than that of the gate electrode.

The embodiment of the present invention has been described in the case of a single MOSFET. However, it should be noted that this embodiment can also be applied to a plurality of devices, a group of elements constituting a part of a semiconductor device, and a MOSFET having a different conductivity. In the case of a MOSFET having a plurality of junction depths, it is clear that the shallowest junction depth from the lower surface of the NiSi layer must be referred to determine a critical temperature for leakage suppression.

Figure 17:
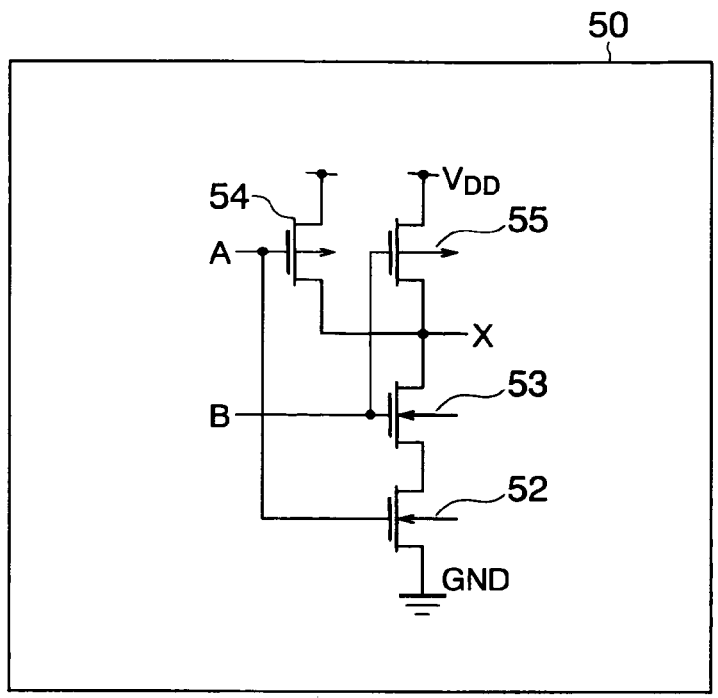
FIG. 17 is a block diagram showing the structure of a semiconductor device according to the embodiment of the present invention.
Figure 18:
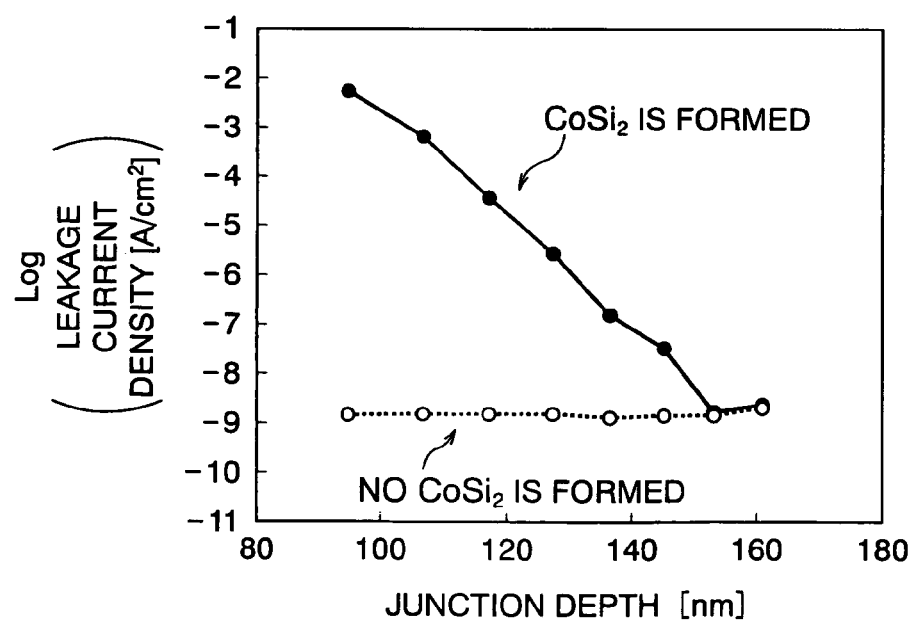
FIG. 18 shows the value of junction leakage current together with the reference value as functions of the junction depth, the value of junction leakage being measured when a $CoSi_2$ layer having a thickness of 35 nm is formed on the n+/p junction having various junction depths, and the reference value being for the case where no silicide is formed.

The MOSFET of the aforementioned embodiment can be applied to, for example, n-type MOSFETs 52 and 53, and p-type MOSFETs 54 and 55 for constituting a logic circuit 50 as shown in FIG. 17. The logic circuit 50 is a NAND circuit constituted by the two serial-connected n-type MOSFETs 52 and 53, and the two parallel-connected p-type MOSFETs 54 and 55. In FIG. 17, when both the two inputs A and B are at the "1" level at the same time, the two serial-connected n-type MOSFETs 52 and 53 are simultaneously turned ON, thereby obtaining the "0" level at the output X. When either of the two inputs A and B is at the "0" level, either of the two parallel-connected p-type MOSFETs 54 and 55 is turned ON, thereby obtaining the "1" level at the output X. When both the two inputs A and B are at the "0" level at the same time, the two parallel-connected p-type MOSFETs 54 and 55 are simultaneously turned ON, thereby obtaining the "1" level at the output X.

In the aforementioned embodiment, the gate dielectric film is formed of a silicon oxide having a dielectric constant of 3.9. However, another high permittivity insulating layer, for example, HfSiON, HfAlON, LaAlO, etc., having a dielectric constant of 3.9 or more, can also be used.

Furthermore, in the aforementioned embodiment, the gate electrode is constituted from a polycrystalline silicon and an NiSi layer thereon. However, it is possible that the polycrystalline layer is entirely silicided, so that the gate electrode is completely formed of an NiSi layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor device comprising a semiconductor element including:
    a gate electrode formed on a silicon semiconductor substrate;
    source and drain regions formed at both sides of the gate electrode in the silicon semiconductor substrate;
    an NiSi layer formed on the source and drain regions;
    an insulating layer formed on the NiSi layer; and
    a plug of a metal material containing copper formed in the insulating layer so as to be electrically in contact with the NiSi layer,
    wherein a junction depth of the source and drain regions ranges from 20 nm to 60 nm from a lower surface of the NiSi layer, Ni atoms exist in the source and drain regions, and a concentration of the Ni atoms at the junction depth being at $1.6 \times 10^{14}$ cm$^{-3}$ or less.

2. The semiconductor device according to claim 1, wherein the concentration of the Ni atoms in the silicon semiconductor substrate at a portion 10 nm in depth from the lower surface of the NiSi layer is at $5 \times 10^{18}$ cm$^{-3}$ or more, and $3 \times 10^{21}$ cm$^{-3}$ or less.

3. The semiconductor device according to claim 1, further comprising a silicon nitride layer formed to cover the NiSi layer and to have an optical refractive index of 1.89 or less.

4. The semiconductor device according to claim 1, wherein the gate electrode is completely formed of the NiSi layer.

5. The semiconductor device according to claim 1, wherein a plurality of the semiconductor elements are formed on the silicon semiconductor substrate, each being isolated by an insulating layer filling up shallow trenches formed in the silicon semiconductor substrate.

6. The semiconductor device according to claim 5, wherein n-type MOSFETs and p-type MOSFETs constitute a logic circuit.

7. The semiconductor device according to claim 2, further comprising a silicon nitride layer formed to cover the NiSi layer and to have an optical refractive index of 1.89 or less.

8. The semiconductor device according to claim 2, wherein the gate electrode is completely formed of the NiSi layer.

9. The semiconductor device according to claim 2, wherein a plurality of the semiconductor elements are formed on the silicon semiconductor substrate, each being isolated by an insulating layer filling up shallow trenches formed in the silicon semiconductor substrate.

10. The semiconductor device according to claim 9, wherein n-type MOSFETs and p-type MOSFETs constitute a logic circuit.

11. The semiconductor device according to claim 1 further comprising an insulating layer, having a dielectric constant of 3.9 or more, between the gate electrode and the silicon semiconductor substrate.

12. The semiconductor device according to claim 2, further comprising an insulating layer, having a dielectric constant of 3.9 or more, between the gate electrode and the silicon semiconductor substrate.

* * * * *